United States Patent

McLellan et al.

[11] Patent Number: 5,647,121
[45] Date of Patent: Jul. 15, 1997

[54] METHOD OF ASSEMBLING ELECTRONIC COMPONENT

[75] Inventors: Neil McLellan, Garland; Mike Strittmatter, Carrollton; Joseph Patrick Hundt, Corinth; Christopher M. Sells; Francis A. Scherpenberg, both of Carrollton, all of Tex.

[73] Assignee: Dallas Semiconductor Corporation, Dallas, Tex.

[21] Appl. No.: 487,821

[22] Filed: Jun. 7, 1995

Related U.S. Application Data

[62] Division of Ser. No. 92,631, Jul. 16, 1993, abandoned.

[51] Int. Cl.$^6$ ........................................... H05K 3/34
[52] U.S. Cl. ...................... 29/840; 29/827; 439/70; 439/71
[58] Field of Search ................... 29/827, 8, 840; 228/180.22, 180.21; 439/70, 71

[56] References Cited

U.S. PATENT DOCUMENTS

| | | | |
|---|---|---|---|
| 4,142,287 | 3/1979 | Grabbe | 29/827 |
| 4,371,912 | 2/1983 | Guzik | 29/840 X |
| 4,646,435 | 3/1987 | Grassover | 228/180.22 X |
| 4,648,666 | 3/1987 | Lovell . | |
| 4,677,458 | 6/1987 | Morris | 439/71 |
| 4,718,855 | 1/1988 | Billman et al. | 439/70 |
| 4,759,491 | 7/1988 | Fisher | 228/180.21 |
| 4,876,465 | 10/1989 | Podkowa et al. . | |
| 4,959,646 | 9/1990 | Podkowa et al. . | |
| 5,005,501 | 4/1991 | Podkowa . | |
| 5,050,113 | 9/1991 | Podkawa et al. . | |
| 5,197,142 | 3/1993 | Williamm et al. . | |

Primary Examiner—Carl J. Arbes
Attorney, Agent, or Firm—Jenkens & Gilchrist

[57] ABSTRACT

A socket system that comprises a printed circuit board; an electrical module; and a socket having a hollow core. The socket holds the electrical module and is capable of electrically coupling the electrical module to the printed circuit board. The electrical module has at least one electrical lead. The socket has at least one electrical lead capable of electrically coupling with the electrical lead(s) of the electrical module. The electrical module comprises a second printed circuit board having a first and second surface; a lithium battery positioned on the first surface of the second printed circuit board and electrically coupled with the second printed circuit board, a crystal positioned on the first surface of said second printed circuit board and electrically coupled with the second printed circuit board, and an integrated circuit positioned on the second surface of the second printed circuit board.

11 Claims, 6 Drawing Sheets

METHOD OF ASSEMBLING ELECTRONIC COMPONENT

This application is a division of application Ser. No. 08/092,631 filed Jul. 16, 1993, abandoned.

PARTIAL WAIVER OF COPYRIGHT PURSUANT TO 1077 O.G. 22(Mar. 20, 1987)

(C) Copyright, Dallas Semiconductor Corporation 1993. All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO RELATED APPLICATIONS

This application hereby incorporates by reference the following co-assigned issued patents and patent applications:

| DSC-# | Patent Number/ Serial Number | Issue Date/ Filing Date | Title |
| --- | --- | --- | --- |
| 69 | 5,050,113 | 09/17/91 | Low Power Timekeeping system |
| 70 | 4,959,646 | 09/25/90 | Dynamic PLA Time Circuit |
| 71 | 5,003,501 | 03/26/91 | Precharge Circuitry and Bus for Low Power App'ns |
| 72 | 4,873,665 | 10/10/89 | Dual Storage Cell Memory |
| 72A | 542,689 | 06/25/90 | Dual Port Static RAM with Bidirectional Shift capability (as amended) |
| 73 | 5,197,142 | 03/23/93 | Memory Arbitration Between Timekeeping Circuitry and General Purpose Computer (as amended) |
| 81 | 4,876,465 | 10/24/89 | Dynamic CMOS Buffer for Low Current Switching |

FIELD OF INVENTION

The present invention relates generally to systems of low profile sockets and modules that are compatible with existing surface mountable systems, methods, and applications and, more particularly, but not by way of limitation, relates to unique sockets and unique modules that have unique features that allow increased density and reduced profile.

BACKGROUND

Surface mount packaging technology has become a pronounced trend over the past several years and has dramatically impacted modern packaging technology. In fact, this trend has become so pronounced that many board assembly operations do not have wave solder capabilities (for use in traditional hole insertion processes) at all. Instead, these modern board assembly operations have 100% of their production in the form of surface mount assembly.

The prevalence of surface mount packaging technology and the associated advantages have forced component manufacturers to redesign and reconfigure many products to make them compatible with existing surface mount package families. This has poised unique problems for component manufacturers, especially for those manufactures that manufacture products that are sensitive to temperature (i.e., clocks).

SUMMARY OF THE INVENTIONS

The present invention provides low profile sockets and modules for surface mountable applications. In particular, preferred embodiments of the socket/module system are comprised of a first printed circuit board, an electrical module, and a socket having a hollow core. The socket and module are low profile and compatible with existing surface mounting processes and structures. The socket holds an electrical module and is capable of electrically coupling the electrical module to the first printed circuit board. The electrical module comprises a second printed circuit board and a host of electrical elements electrically coupled with the first printed circuit board. The electrical module has at least one electrical lead and the socket has at least one electrical contact capable of electrically coupling with the electrical lead(s) of the electrical module. The electrical lead(s) of the electrical module preferably have a "F" clip lead design resembling "J" lead designs commonly used in plastic leaded chip carrier packages, which allows for good insertion of the electrical module and retention of the electrical module by the socket. In addition, preferred embodiments have a fewer number of leads (e.g., half as much) than traditional embodiments.

The second printed circuit board in the module preferably has a first and second surface. A lithium battery is positioned on the first surface of the second printed circuit board and electrically coupled with the second printed circuit board. A crystal is positioned on the first surface of the second printed circuit board and electrically coupled with the second printed circuit board. An integrated circuit is positioned on the second surface of the second printed circuit board. The printed circuit boards are thin and multilayered. The integrated circuit in preferred embodiments is a clock circuit or a non-volatile static random access memory (NVSRAM) controller and static random access memory (SRAM). The first surface and the second surface are opposite one another.

A tub or cap encloses or caps the electrical module, which may include a lithium battery and the crystal, and is comprised of injection molded plastic. The walls of the tub or cap are thinned and curved to permit a low profile for the overall system. The electrical module may be temperature sensitive. The electrical module may also be comprised of a plurality of electrical components, wherein some of the plurality of electrical components are sensitive to temperature. The socket is surface mountable and is compatible with surface mountable integrated package sockets. The electrical contact(s) of the socket are mountable to the first printed circuit board (i.e., motherboard) using surface mount technology. Alternate preferred embodiments of the socket have at least one interior wall with the electrical contacts(s) located on the interior wall(s). The second surface generally faces the second printed circuit board. Alternate preferred embodiments of the clock module position a lithium battery, a crystal, and a integrated circuit all on a first surface of a printed circuit board. The first surface and the second surface are opposite one another. The second surface faces the printed circuit board. The integrated circuit is sensitive to temperature and is typically a clock module or a NVS-RAM controller and SRAM.

Preferred embodiments of the socket have a hollow body capable of holding an electrical module and electrical contacts that are capable of electrically coupling the electrical module to a printed circuit board. The hollow body has a recess or hole in one end of the hollow body, which is shaped such that it accepts the electrical module. The electrical module has at least one electrical lead and the socket has at least one electrical contact capable of electrically connecting to the electrical lead(s) of the electrical element. The hollow body of the socket is preferably comprised of poly phenelyne sulfide. One interior surface of the body of the socket has electrical contacts positioned thereon. Interior walls in alternate preferred embodiments have two interior walls that face one another and have contacts positioned on each interior wall. The electrical lead(s) of the body of the socket are mountable to the printed circuit board using surface mount technology. The electrical leads(s) of the socket have a "F" clip lead design resembling "J" lead designs commonly used in plastic leaded chip carrier packages, which grip the contacts of the socket to provide a secure unit. A cap encloses the electrical module. Moreover, the shape of cap is such that it can be easily grasped by robotic arms, which are commonly used in modern manufacturing operations. The electrical module is temperature sensitive and/or may be comprised of a plurality of electrical components, wherein some of the plurality of electrical components are temperature sensitive. Preferred embodiments of the socket are compatible with surface mountable integrated package sockets.

Preferred processes are comprised of the following steps: (a) providing a printed circuit board; (b) mounting a socket on the printed circuit board; (c) placing the printed circuit board with the socket mounted on it in surface mount reflow oven and heating the printed circuit board and the socket in order to bond the socket to the printed circuit board; and (d) inserting an electrical element in the socket. As a result, the electrical element placed in the socket avoids serious exposure to increased temperatures commonly encountered in surface mount reflow ovens. The electrical module and socket have been specially designed to provide a low profile and increased density. Moreover, the electrical module and socket are compatible with existing surface mount processes and systems and embodies the features described above. The printed circuit board includes a variety of other electrical components. The surface mount reflow oven heats the printed circuit board and the socket through one of the means selected from the group consisting of convection, impinging radiation, and condensation. The electrical element is temperature sensitive and typically a clock module or a NVSRAM controller and SRAM. Preferred embodiments of the clock module comprises a second printed circuit board having a first and second surface; a lithium battery; a crystal; and an integrated circuit, wherein the lithium battery and the crystal are mounted on a first surface of the printed circuit board and the integrated circuit is mounted on a second surface of the second printed circuit board. Alternate preferred embodiments of the clock module position a lithium battery, a crystal, and an integrated circuit all on a first surface of a printed circuit board. The first surface and the second surface are opposite one another. The second surface faces the printed circuit board. The integrated circuit is sensitive to temperature. Alternate preferred embodiments employ a water wash procedure, which cleans the first printed circuit board of the residue of water soluble flux before inserting the electrical module. The preferred procedures permit this additional step, which could otherwise damage (i.e., short out) the battery (i.e., lithium battery).

The disclosed invention has the following advantages. First, the socket/module system and related processes can be used to install electrical components (present in the electrical module) to printed circuit boards using surface mounting procedures without damaging the electrical components that are temperature sensitive. The socket/module systems and related processes protect electrical components in the electrical module from overheating. Examples of electrical components that are temperature sensitive include temperature sensitive integrated circuits, lithium batteries, oscillator crystals, and non-volatile clock circuits. This ability provides a host of additional advantages associated with surface mount packaging technologies, such as the reduction of size, the increased efficiency, the reduction of manufacturing cost, etc.

Second, the socket/module system and processes are relatively small in size and do not require an inordinate amount of space, especially when compared with modules with similar functionality in traditional dual-in-line package ("DIP") configurations. The disclosed socket/module system is small enough to be compatible with generic surface mountable sockets. In short, the socket/module system and processes offer an unusually low profile (i.e., approximately 0.23" high) and increased density of electrical components, which is important with the increased emphasis on size found in modern embodiments of personal computers (i.e., laptops and notebooks).

Third, the socket/module system and related processes are compatible with solder reflow assembly and compatible with off-the-shelf surface mountable package sockets, which is significant because surface mountable sockets are low cost and can be readily available. In particular, the socket/module system and related processes are compatible with traditional waterwash processes. These waterwash processes generally remove a water soluble flux to clean the printed circuit boards.

Fourth, the socket/module system and related processes are light weight and require less surface area on the board.

Fifth, the printed circuit board socket/module system and related processes offer reduced signal interference and greater accuracy. Given the fact the electrical module may be bought and sold as a unit, the individual components can be interconnected and calibrated more accurately than in processes and systems that install the integrated circuit (i.e., clock circuitry) first without the lithium battery and crystal and then later add the lithium battery and the crystal to the electrical module after the reflow process and then calibrate the resulting system.

Sixth, the socket/module system and related processes can be easily calibrated.

Seventh, the socket system and related processes promote long battery life and reliability.

Eighth, the socket system and related processes permit easy and correct insertion into the socket/module system.

Ninth, reducing the number of leads reduces the cost of the socket (and module) as well as of the resulting overall system.

Tenth, the holes in the socket help provide a lower profile of the resulting overall system.

BRIEF DESCRIPTION OF THE DRAWINGS

Further features and advantages will become apparent from the following and more particular description of the various embodiments of the invention, as illustrated in the accompanying drawings, wherein.

DETAILED DESCRIPTION OF THE PREFERRED EMBODIMENTS

Figure 1A:
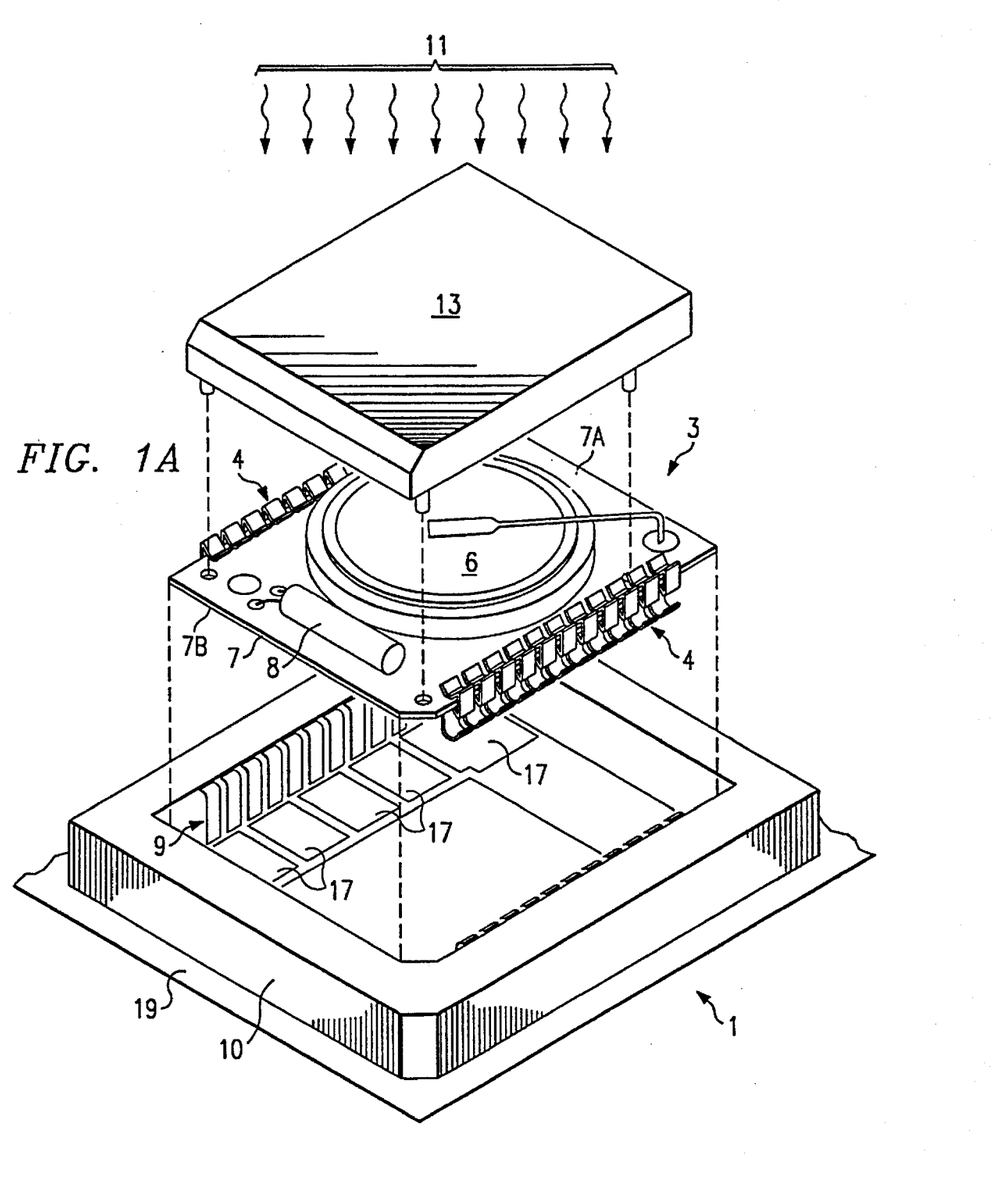
FIG. 1A is an illustration of a preferred embodiment of the low profile socket/module system when the electrical module utilizes a chip-on-board assembly without extra contact gaps.

FIG. 1A is an illustration of a preferred embodiment of the low profile socket/module system for surface mountable applications. The system is generally denoted by reference number 1. Electrical module is a chip-on-board assembly generally denoted by reference number 3, which comprises in this embodiment a variety of electrical components: lithium battery 6 and crystal 8 on a first surface 7A of first printed circuit board 7 and integrated circuit 15 (i.e., a clock circuit) on a second surface 7B of first printed circuit board 7, which is not apparent in FIGS. 1A and 1B (See FIG. 6). Electrical module could be or include a variety of other electrical elements, such as those shown in FIGS. 7–10. The chip-on-board ("COB") assembly provides a lower profile for the resulting structure, which minimizes its protrusion out of the socket 10. All of the electrical components of electrical module 3 are positioned proximate to one another. Please note that while FIG. 1A shows lithium battery 6 and crystal 8 positioned on a first surface 7A of first printed circuit board 7 and integrated circuit 15 on a second surface 7B that faces in an opposite direction of first printed circuit board 7, other electrical elements could be positioned elsewhere on either the first surface 7A or the second surface 7B or, perhaps, another surface. First printed circuit board 7 is preferably a thin (approximately 0.025" thick) multilayer design with "F" clips soldered to appropriate sides for connection to socket 10. In addition, epoxy glob material is used to seal and enclose integrated circuit 15 on the second surface 7B.

Figure 1B:
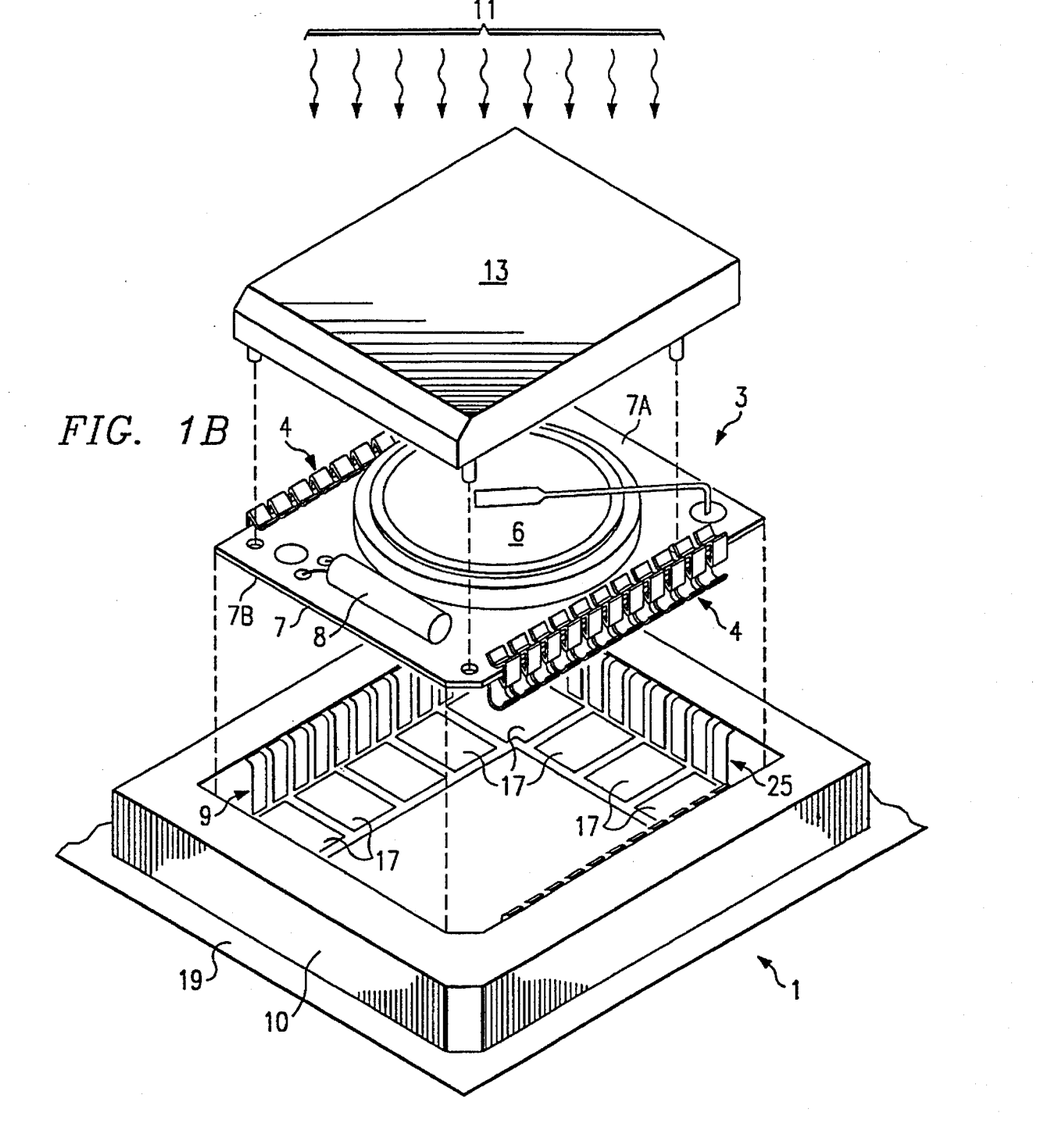
FIG. 1B is an illustration of a preferred embodiment of the low profile socket/module system when the electrical module utilizes a chip-on-board assembly with extra contact gaps.

First printed circuit board 7 has at least one lead 4 (or conductive pin 4) (please note that a plurality of component leads 4 are actually shown in FIGS. 1A and 1B). Integrated circuits in preferred embodiments typically have 44, 52, or 68 component leads 4 (see FIGS. 2A and 2B), but integrated circuits in alternate preferred embodiments may have as many as 8 leads or higher. First printed circuit board 7 inserts or snaps into socket 10, such that plurality of component leads 4 electrically connect to the plurality of socket contacts 9 of socket 10. FIG. 1B is an illustration of a preferred embodiment of the low profile socket/module system for surface mountable systems and methods with extra contact gaps 25 to house extra socket contacts 9 of socket 10 (if needed). The embodiment shown in FIG. 1B provides manufacturing flexibility. In particular, socket 10 can be standardized for production purposes and yet still be customized to accept and hold various electrical modules 3 with various sizes and requirements (i.e., lead requirements). The requirements and unique features of second printed circuit board 19 (i.e., the position of other electrical components [not shown] that have certain electrical routing requirements of buried electrically conductive interconnects within second printed circuit board 19) may also dictate the position of socket contacts 9 (of socket 10) and of component lead(s) 4 (of electrical module 3). Second printed circuit board 19 is larger than first printed circuit board 7. Please note that corresponding items have been labeled consistently between FIGS. 1A and 1B.

Component lead(s) 4 are external and will be preferably soldered "F" clips designed to mimic "J" leads of plastic leaded chip carrier ("PLCC") socket packages to firmly retain the electrical module(s). As a result, the cross sectional profiles of the package resemble the profiles of PLCC packages and, thus, are compatible with more traditional PLCC sockets. Alternate embodiments are designed to be compatible with quad flat pack ("QFP") sockets. Preferred embodiments, however, have component lead(s) 4 on a minimal number of interior surfaces (i.e., one or two sides), which substantially reduces the manufacturing cost associated with the finished product as well as the overall size. In addition, the reduction of the number of internal surfaces of socket 10 and electrical module 3 containing socket contacts 9 and component lead(s) 4 respectively reduces and simplifies the routing requirements of buried electrically conductive interconnects within second printed circuit board 19. In particular, the electrical connections buried in the circuit board are straighter and otherwise more manageable than in situations where the socket and module has contacts and leads on more than two sides of socket 10.

Preferred embodiments of socket 10 are generally a surface mount PLCC compatible designs. Socket 10 is hollow and has specially designed thin walls (i.e., approximately 10 mils thick). Alternate preferred embodiments profile quad flat pack (QFP) designs. As noted, preferred embodiments also have leads on a minimal number of times (i.e., one or two sides). Preferred embodiments of socket 10 are generally comprised of the following materials: nylon, thermal plastic (LCP), and poly phenelyne sulfide. In addition, the edges of socket 10 and/or electrical module 3 are chamfered to encourage and hopefully guarantee correct insertion of electrical module 3 into socket 10. Preferred embodiments for socket 10 have a relief hole or recess 17 in the bottom surface of socket 10 which is positioned adjacent or on top of a second printed circuit board 19 to allow electrical components to extend further into socket 10. Additional relief holes 17 can also be used to reduce manufacturing cost, increase density, and reduce the profile of the resulting system. However, the presence of the relief hole 17 located to accept electrical components positioned on the underside of first printed circuit board 7 is especially important, because it allows electrical module 3 with first printed circuit board 7 and associated electrical components to sink lower into socket 10 and, therefore, reduce the cross-sectional profile of the overall system 1 (see FIGS. 2A, 2B, 3A, and 3B). Recess hole(s) 17 are preferably rectangular, but may assume other shapes as well.

Socket 10 is typically positioned on a second printed circuit board 19, which may contain a variety of other electrical components electrically connected or bonded to the larger printed circuit board, such as microprocessors and memory chips. Like first printed circuit board 7, second printed circuit board 19 is preferably a thin multilayer design.

Figure 2A:
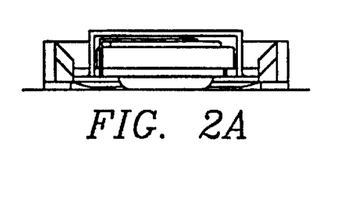
FIGS. 2A and 2B illustrate relative differences in height for a 44 pin socket with and without the relief hole respectively.
Figure 2B:
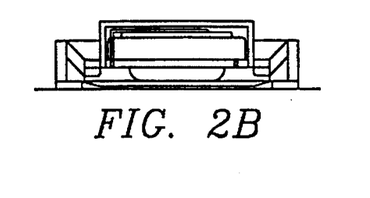
Figure 3A:
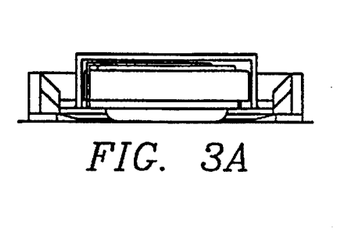
FIGS. 3A and 3b illustrate relative differences in height for a 52 pin socket with and without the relief hole respectively.
Figure 3B:
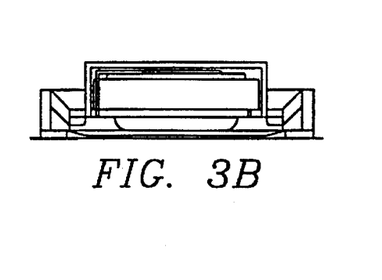

FIGS. 2A and 2B illustrate relative differences in height for a 44 pin socket with electrical module 3 with and without the relief hole respectively. In particular, as shown in FIG. 2B, a typical 44 pin socket 10 is 0.900" square and has a height that approximates 0.255" (when the socket assembly is loaded upon the second printed circuit board 19), whereas, as shown in FIG. 2A, a typical 44 pin socket 10 has a height that approximates 0.222" (when the socket assembly is loaded upon the second printed circuit board 19). In particular, as shown in FIG. 3B, a typical 52 pin socket 10 is 1.000" square and has a height that approximates 0.285" (when the socket assembly is loaded upon the second printed circuit board 19), whereas, as shown in FIG. 3A, a typical 52 pin socket 10 has a height that approximates 0.252" (when the socket assembly is loaded upon the second printed circuit board 19). Module 3 is also of low mass to preclude fretting corrosion.

Tub or cap 13 is positioned over and around (encapsulates) lithium battery 6 and crystal 8 and over first printed circuit board 7 and is attached or affixed to first printed circuit board 7. Tub 13 is typically filled with epoxy to secure it around the electrical components to provide additional mechanical security, such as damaging the components from handling or electrically shorting the components out (i.e., covering the anode and cathode of the battery), and additional protection for lithium battery 6. Tub 13 is typically comprised of injection molded plastic, nylon, thermal plastic, and liquid crystal polymers (LCP). Tub 13 has specially designed thin walls (i.e., 0.616") to maximize the density of components in the electrical module 3 as well as in the overall system in which the socket/module system is placed. Tub 13 is also chamfered to help visually orient tub 13 with socket 10. Moreover, the shape of tub 13 is such that it can be easily grasped by robotic arms.

Figure 4:
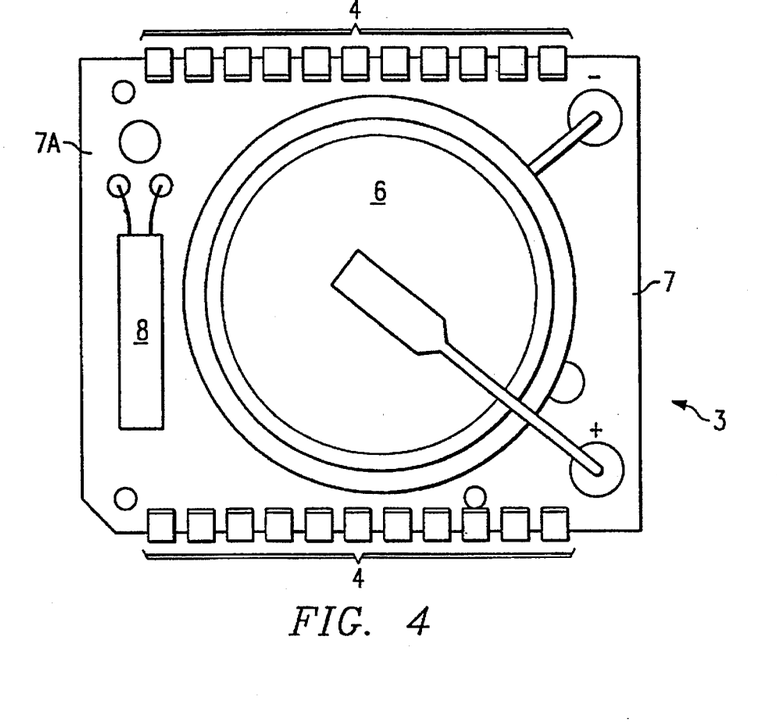
FIG. 4 is an illustration of a top view of the printed circuit board and associated electrical components (i.e., the lithium battery, the integrated circuit, and the crystal) shown in FIGS. 1A and 1B.

FIG. 4 is an illustration of a top view of electrical module 3 and some of the associated electrical components (i.e., first printed circuit board 7, lithium battery 6, crystal 8) and component lead(s) 4 shown in FIG. 1.

Figure 5A:
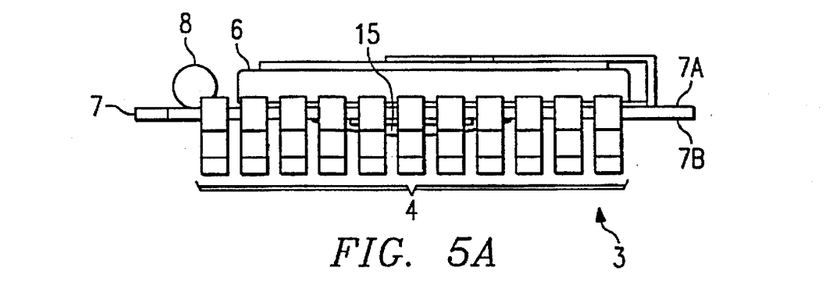
FIG. 5A is an illustration of the front view of the printed circuit board and associated electrical components (i.e., the lithium battery, the integrated circuit, and the crystal) shown in FIGS. 1A and 1B.

FIG. 5A is an illustration of the front view of the first printed circuit board 7 and associated electrical components (i.e., lithium battery 6, crystal 8, and integrated circuit 15) shown in FIGS. 1A and 1B.

Figure 5B:
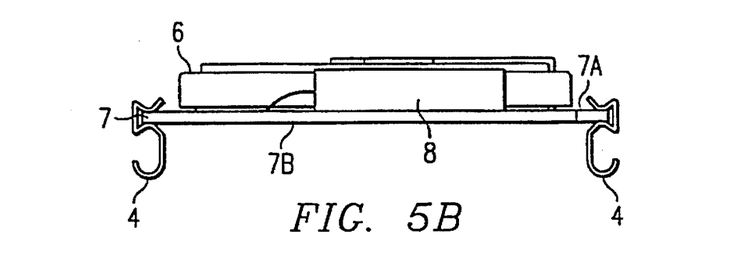
FIG. 5B is an illustration of the side view of the printed circuit board and associated electrical components (i.e., the lithium battery, the integrated circuit and the crystal) shown in FIGS. 1A and 1B.

FIG. 5B is an illustration of the side view of the first printed circuit board 7 and associated electrical components (i.e., lithium battery 6, crystal 8, and integrated circuit 15) shown in FIGS. 1A and 1B.

Figure 6:
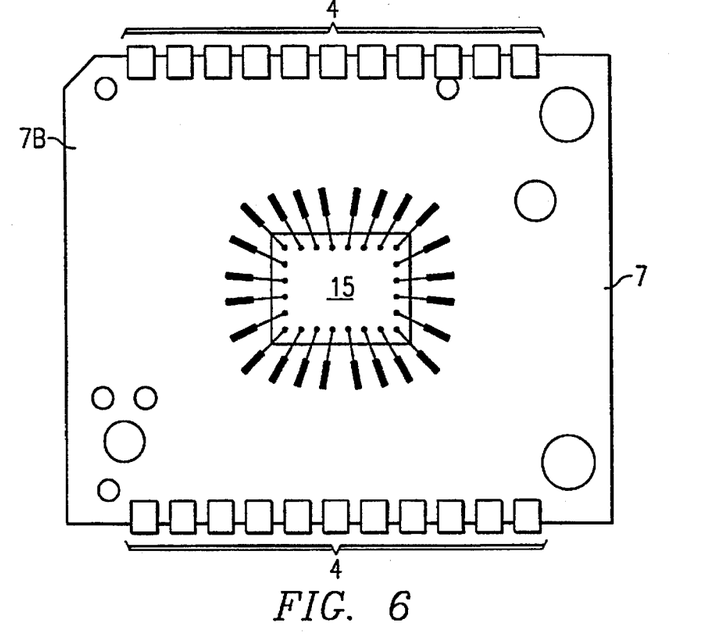
FIG. 6 is an illustration of the bottom view of the printed circuit board and associated electrical components (i.e., the lithium battery, the integrated circuit, and the crystal) shown in FIGS. 1A and 1B.

FIG. 6 is an illustration of the bottom view of the first printed circuit board 7 and the integrated circuit 15 positioned on a second surface 7B of first printed circuit board 7 (i.e., underneath) that is opposite the first surface 7A of first printed circuit board 7 on which lithium battery 6 and crystal 8 is shown in FIGS. 1A and 1B, but not shown in FIG. 6. Preferred embodiments may utilize a "glob" top, which covers, encloses, and protects integrated circuit 15. Please note, however, it has been removed in FIG. 6 in order to view integrated circuit 15.

Figure 7:
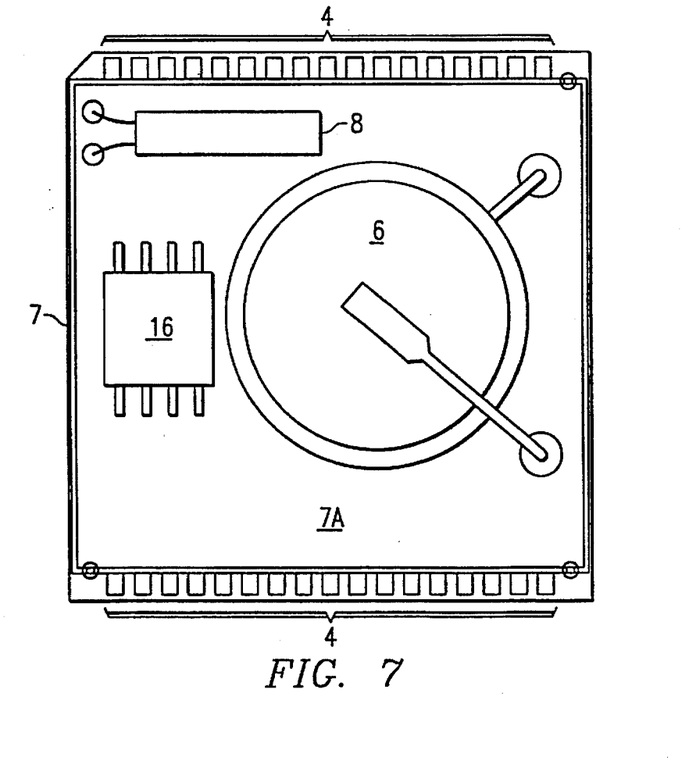
FIG. 7, is an illustration of a top view of the printed circuit board and associated electrical components (i.e., the lithium battery, the crystal, and the two integrated circuits, such as a static random access memory ("SRAM") and controller integrated circuit) in another preferred embodiment of the low profile socket/module system when the electrical module utilize a chip-on-board assembly with at least two integrated chips located on the printed circuit board of the chip-on-board assembly, such as with nonvolatile SRAMs (SRAM and controller chip)

FIG. 7 is an illustration of a top view of first surface 7A of the first printed circuit board 7 and associated electrical components (i.e., lithium battery 6, crystal 8, and integrated circuits 15 and 16, such as a SRAM and controller integrated circuit) in another preferred embodiment of the low profile socket/module system for surface mountable applications. In particular, FIG. 7 shows electrical module 3 utilize a COB assembly with at least two integrated chips located on the first printed circuit board 7 of the COB assembly (integrated circuit 16 on first surface 7A of first printed circuit board 7 and integrated circuit 15 on second surface 7B on first printed circuit board 7, such as with NVSRAMs (SRAM and controller chip). Please note that corresponding items have been labeled consistently between FIGS. 1A and 1B, except FIG. 7 also illustrates the addition of an integrated circuit 16 on the first surface 7A of first printed circuit board 7.

Figure 8A:
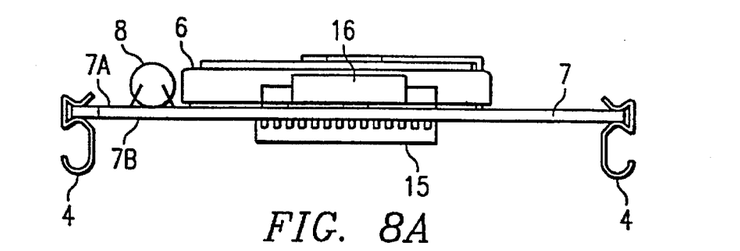
FIG. 8A is an illustration of the front view of the printed circuit board and associated electrical components (i.e., the lithium battery, the crystal, and the two integrated circuits, such as an SRAM and controller integrated circuit) shown in FIG. 7.

FIG. 8A is an illustration of the front view of first printed circuit board 7 and associated electrical components (i.e., lithium battery 6, crystal 8, and integrated circuits 15 and 16, such as an SRAM and controller integrated circuit) shown in FIG. 7.

Figure 8B:
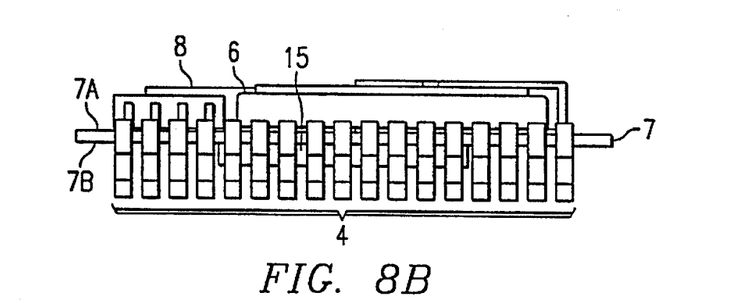
FIG. 8B is an illustration of the side view of the printed circuit board and associated electrical components (i.e., the lithium battery, the crystal, and the two integrated circuits, such as an SRAM and controller integrated circuit) shown in FIG. 7.

FIG. 8B is an illustration of the side view of first printed circuit board 7 and associated electrical components (i.e., lithium battery 6, crystal 8, and integrated circuits 15 and 16, such as an SRAM and controller integrated circuit) shown in FIG. 7.

Figure 9:
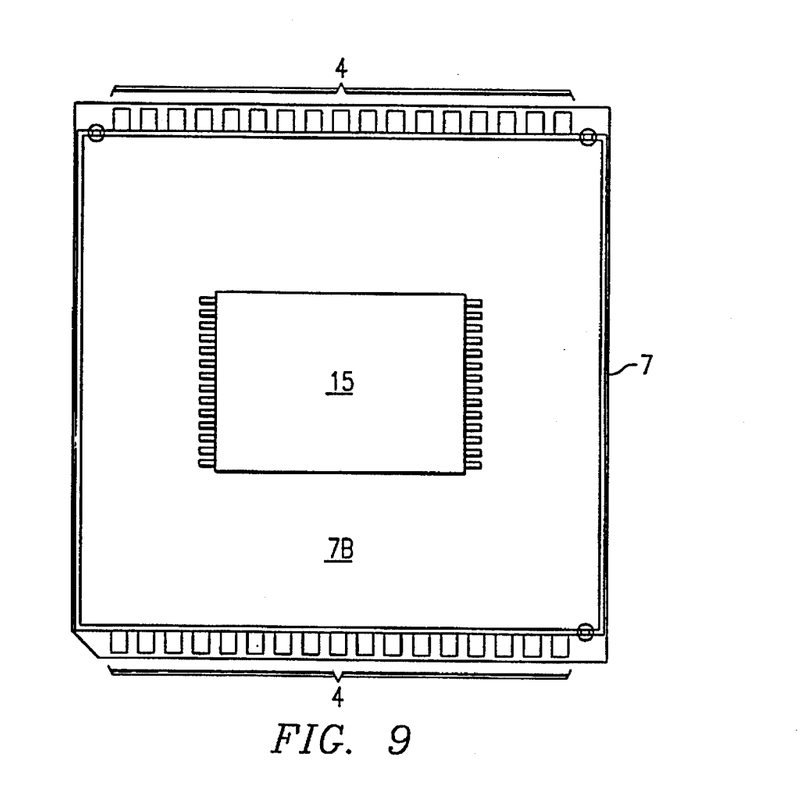
FIG. 9 is an illustration of the bottom view of the printed circuit board and associated electrical components (i.e., the lithium battery, the crystal, and the two integrated circuits, such as an SRAM and controller integrared circuit) shown in FIG. 7.

FIG. 9 is an illustration of the bottom view of second surface 7B of first printed circuit board 7 and associated electrical components (i.e., lithium battery 6, crystal 8, and integrated circuits 15 and 16, such as an SRAM and controller integrated circuit) shown in FIG. 7. Please note that FIGS. 7, 8A, 8B, and 9 show integrated circuit 15 positioned on a second surface 7B (i.e., underneath) of first printed circuit board 7 in a TSOP package as well as integrated circuit 16 on a first surface 7A (i.e., on top) of first printed circuit board 7 in a TSOP package, which is surface mounted to first printed circuit board 7. Similar to the glob top, the TSOP package covers, encloses, and protects integrated circuit 15.

Figure 10A:
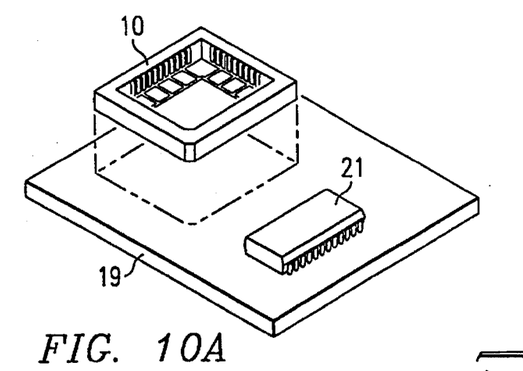
FIGS. 10A, 10B, 10C, and 10D are illustrations of the steps comprised in a preferred process to thermally protect electrical components.
Figure 10B:
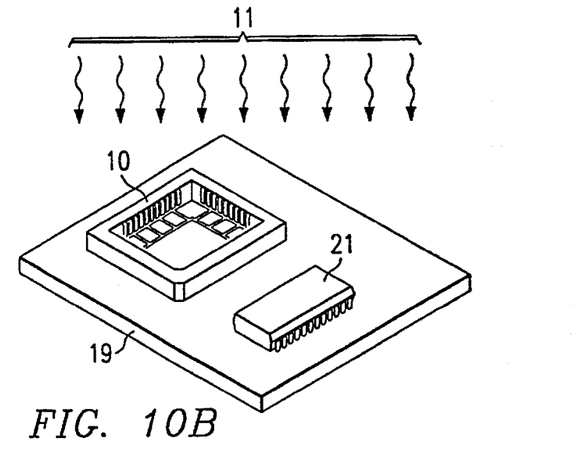
Figure 10C:
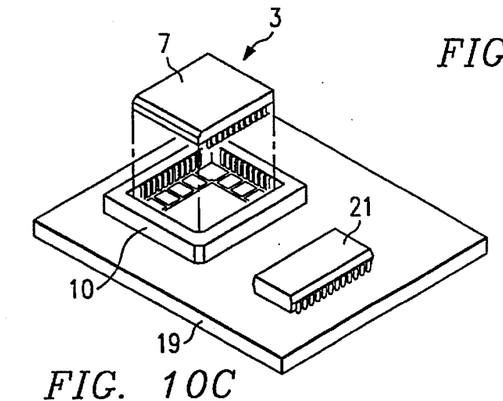
Figure 10D:
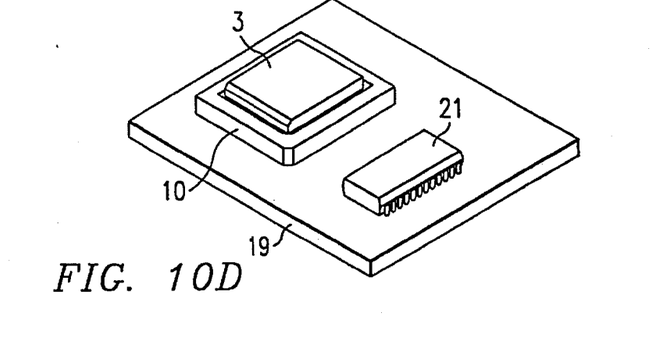

FIGS. 10A, 10B, 10C, and 10D illustrate the steps comprised in a preferred process to thermally protect electrical components. As shown in FIG. 10A, socket 10 is mounted on second printed circuit board 19. Second printed circuit board 19 may include a variety of other electrical parts 21. As shown in FIG. 10B, second printed circuit board 19, which includes among other things socket 10, runs through surface mount reflow oven, which heats second printed circuit board 19 through convection and impinging radiation (in the infrared spectrum) and/or through condensation (i.e., vapor phase) from above, as referenced by heat waves 11. As shown in FIG. 10C, electrical module 3 (containing the clock module, which is comprised of lithium battery 6, crystal 8, and integrated circuit 15) is then inserted into socket 10. As shown in FIG. 10C, electrical module 3 is then effectively positioned on second printed circuit board 19 and electrically connected via socket 10 to second printed circuit board 19, as shown in FIG. 10D. This process effectively removes electrical module 3 from the reflow process in a surface mount reflow oven. This process would damage electrical module 3, because the surfaces of electrical module 3 facing the surface mount reflow oven would typically absorb heat through convection and impinging radiation (in the infrared spectrum) and/or through condensation (i.e., vapor phase) from above, as referenced by heat waves 11.

FURTHER MODIFICATIONS AND VARIATIONS

Although the invention has been described with reference to a specific embodiment, this description is not meant to be construed in a limiting sense. As described above, various modifications of the disclosed embodiment as well as alternate embodiments of the invention will become apparent to persons skilled in the art upon reference to the description of the invention. Accordingly, it should be understood that the modifications and variations suggested above and below are not intended to be exhaustive. These examples help show the scope of the inventive concepts, which are covered in the appended claims. The appended claims are intended to cover these modifications and alternate embodiments.

What is claimed is:

1. A process, comprising the steps of:

providing a printed circuit board;

mounting a socket on said printed circuit board;

placing said printed circuit board with said socket mounted on it in a surface mount reflow oven and heating said printed circuit board and said socket to bond said socket to said printed circuit board; and inserting an electrical module in said socket, wherein said electrical module is a clock module, which comprises a second printed circuit board having a first and second surface, a lithium battery, a crystal, and an integrated circuit, wherein said lithium battery and said crystal are mounted on a first surface of said second printed circuit board and said integrated circuit is mounted on a second surface of said second printed circuit board.

2. The process of claim 1, wherein said first surface and said second surface are opposite one another.

3. The process of claim 1, wherein said second surface faces said printed circuit board.

4. The process of claim 1, wherein said integrated circuit is sensitive to temperature.

5. A method for assembling an electronic component, comprising the steps of:

placing a socket on a first printed circuit board;

bonding the socket to the first printed circuit board;

inserting an electrical module in the socket, wherein the electrical module includes a clock having a second printed circuit board, a battery, a crystal and an integrated circuit, such that the battery and the crystal are mounted on a first surface of the second printed circuit board and the integrated circuit is mounted on a second surface of the second printed circuit board.

6. The method as recited in claim 5, wherein said step of bonding the socket to the first printed circuit board further includes the steps of:

placing the first printed circuit board and the socket into a surface mount reflow oven; and heating the printed circuit board and the socket.

7. The method as recited in claim 5, wherein said step of inserting the electronic module into the socket includes the step of aligning the second surface of the second printed circuit board to face the first printed circuit board when the electronic module is inserted into the socket.

8. The method as recited in claim 5, wherein the integrated circuit is sensitive to temperature.

9. A method for assembling an electronic component, comprising the steps of:

placing a socket on a first printed circuit board;

bonding the socket to the first printed circuit board;

inserting an electronic module into the socket, wherein the electrical module includes a clock having a second printed circuit board, a battery, a crystal and a temperature sensitive integrated circuit, such that the battery and the crystal are mounted on a first surface of the second printed circuit board and the integrated circuit is mounted on a second surface of the second printed circuit board.

10. The method as recited in claim 9, wherein said step of bonding the socket to the first printed circuit board further includes the steps of:

placing the first printed circuit board and the socket into a surface mount reflow oven; and heating the printed circuit board and the socket.

11. The method as recited in claim 10, wherein said step of inserting the electronic module into the socket further includes the step of aligning the second surface of the second printed circuit board to face the first printed circuit board when the electronic module is inserted into the socket.

* * * * *

UNITED STATES PATENT AND TRADEMARK OFFICE
CERTIFICATE OF CORRECTION

PATENT NO. : 5,647,121
DATED : Jul. 15, 1997
INVENTOR(S) : McLellan et al.

It is certified that error appears in the above-indentified patent and that said Letters Patent is hereby corrected as shown below:

Column 1, table line 4   Replace "system"
                             With --System--

Column 1, table line 14  Replace "capability"
                             With --Capability--

Column 5, line 20        Replace "3b"
                             With --3B--

Column 5, line 39        Replace "7,"
                             With --7--

Column 5, line 63        Replace "integrared"
                             With --integrated--

Signed and Sealed this

Sixteenth Day of December, 1997

*Attest:*

BRUCE LEHMAN

*Attesting Officer*           Commissioner of Patents and Trademarks